United States Patent
Arya et al.

(10) Patent No.: US 10,598,708 B2
(45) Date of Patent: Mar. 24, 2020

(54) IDENTIFYING AND PRIORITIZING ERRORS IN CONNECTIVITY MODELS OF DISTRIBUTION NETWORKS FOR EFFICIENT FIELD INSPECTIONS

(71) Applicant: International Business Machines Corporation, Armonk, NY (US)

(72) Inventors: Vijay Arya, Bangalore (IN); Sambaran Bandyopadhyay, Bangalore (IN); Mohit Jain, Jharkhand (IN); Rama C. Kota, Bangalore (IN); Rajendu Mitra, Sambhal (IN)

(73) Assignee: International Business Machines Corporation, Armonk, NY (US)

( * ) Notice: Subject to any disclaimer, the term of this patent is extended or adjusted under 35 U.S.C. 154(b) by 687 days.

(21) Appl. No.: 15/097,820

(22) Filed: Apr. 13, 2016

(65) Prior Publication Data

US 2017/0299640 A1    Oct. 19, 2017

(51) Int. Cl.
*G01R 22/06* (2006.01)
*H02J 13/00* (2006.01)
*G01R 31/08* (2006.01)

(52) U.S. Cl.
CPC ........ *G01R 22/068* (2013.01); *H02J 13/0006* (2013.01); *G01R 31/086* (2013.01); *Y04S 10/522* (2013.01)

(58) Field of Classification Search
CPC ............ G01R 31/2829; G01R 19/2513; G01R 22/068; G01R 31/086; G06Q 10/10; H01J 13/0006; Y04S 10/522
See application file for complete search history.

(56) References Cited

U.S. PATENT DOCUMENTS 7,111,018 B1   9/2006   Goodrich et al.
7,945,524 B2   5/2011   Anderson et al.
(Continued)

FOREIGN PATENT DOCUMENTS

WO    2008047386 A2   4/2008

OTHER PUBLICATIONS

Disclosed Anonymously, A Adaptive Method to Intelligently Detect the Inconsistency in Topological Calibration from Power Grid GIS Data. IPCOM000234899D. Feb. 13, 2014.
(Continued)

*Primary Examiner* — Regis J Betsch
*Assistant Examiner* — Kaleria Knox
(74) *Attorney, Agent, or Firm* — Ryan, Mason & Lewis, LLP

(57) ABSTRACT

Methods, systems, and computer program products for prioritizing errors in connectivity models of distribution networks are provided herein. A computer-implemented method includes collecting geo-spatial data arising from each of multiple transformers and multiple customer meters within an electric power distribution network; collecting load data arising from each of the customer meters within the electric power distribution network; assigning one of the transformers to each of the customer meters that is not presently assigned to one of the transformers according to a connectivity model for the distribution network, wherein said assigning is based on the collected multiple items of geo-spatial data and the collected load data; computing an error probability attributable to each of the transformers and the customer meters assigned thereto within the electric power distribution network based on multiple variables; and modifying an existing field inspection schedule corresponding to the electric power distribution network based on said computing.

20 Claims, 4 Drawing Sheets

(56) References Cited

U.S. PATENT DOCUMENTS

| | | |
|---|---|---|
| 9,470,747 B1* | 10/2016 | Mixon ............... G01R 31/2829 |
| 9,766,271 B2 | 9/2017 | May et al. |
| 2006/0179355 A1 | 8/2006 | Bouchard |
| 2010/0231413 A1* | 9/2010 | Conant .................. G06Q 10/10 340/870.02 |
| 2013/0211797 A1 | 8/2013 | Scolnicov et al. |
| 2014/0039818 A1 | 2/2014 | Arya et al. |
| 2015/0012148 A1 | 1/2015 | Bhagaria, Jr. et al. |
| 2016/0109497 A1* | 4/2016 | Aiello ................ G01R 19/2513 324/76.77 |
| 2016/0131501 A1 | 5/2016 | Steigler |
| 2017/0108572 A1 | 4/2017 | Micek et al. |

OTHER PUBLICATIONS

Disclosed Anonymously, An Efficient Power SCADA Records Storage Strategy and Specific Analysis Method. IPCOM000234546D, Jan. 17, 2014.

Disclosed Anonymously, Minimizing Field Inspections to Isolate Connectivity and Theft Solutions in Distribution Networks. IPCOM000237965D, Jul. 23, 2014.

* cited by examiner

US 10,598,708 B2

IDENTIFYING AND PRIORITIZING ERRORS IN CONNECTIVITY MODELS OF DISTRIBUTION NETWORKS FOR EFFICIENT FIELD INSPECTIONS

FIELD

The present application generally relates to information technology, and, more particularly, to distribution network management.

BACKGROUND

A connectivity model (CM) of a distribution grid can specify how the assets and customers of the grid are interconnected downstream of a distribution substation. However, out-of-date CMs, due to deteriorating accuracy, can create problems with respect to repairs and restoration efforts following faults and outages. Such problems can be caused by errors in a CM such as, for example, an identification of which transformer is connected to which branch of the feeder (lateral), which transformer is powered by which phase, which customer is powered by which distribution transformer, etc.

Existing techniques to rectify CMs include power line communication (PLC), which is capital intensive and for which the signal may not propagate across assets or over long distances. Also, existing techniques additionally include field inspections, wherein human workers physically visit assets and installations to inspect and update the CM. However, field inspections can be time-intensive and expensive.

SUMMARY

In one embodiment of the present invention, techniques for identifying and prioritizing errors in connectivity models of distribution networks for efficient field inspections are provided. An exemplary computer-implemented method can include collecting multiple items of geo-spatial data arising from each of (i) multiple transformers within at least a portion of an electric power distribution network and (ii) multiple customer meters within the at least a portion of the electric power distribution network, collecting load data arising from each of the multiple customer meters within the at least a portion of the electric power distribution network, and assigning one of the multiple transformers to each of the multiple customer meters that is not presently assigned to one of the multiple transformers according to an existing connectivity model for the distribution network, wherein said assigning is based on (i) the collected multiple items of geo-spatial data and (ii) the collected load data. The method can also include computing an error probability attributable to each of (i) the multiple transformers and (ii) the multiple customer meters assigned thereto within the at least a portion of the electric power distribution network based on multiple variables pertaining to the relationships between the multiple transformers and the multiple customer meters assigned thereto, and modifying an existing field inspection schedule corresponding to the electric power distribution network based on the computing.

Also, in another embodiment of the invention, an exemplary computer-implemented method can include generating a new field inspection schedule corresponding to the electric power distribution network, to replace an existing field inspection schedule, based on the above computing.

Another embodiment of the invention or elements thereof can be implemented in the form of an article of manufacture tangibly embodying computer readable instructions which, when implemented, cause a computer to carry out a plurality of method steps, as described herein. Furthermore, another embodiment of the invention or elements thereof can be implemented in the form of an apparatus including a memory and at least one processor that is coupled to the memory and configured to perform noted method steps. Yet further, another embodiment of the invention or elements thereof can be implemented in the form of means for carrying out the method steps described herein, or elements thereof; the means can include hardware module(s) or a combination of hardware and software modules, wherein the software modules are stored in a tangible computer-readable storage medium (or multiple such media).

These and other objects, features and advantages of the present invention will become apparent from the following detailed description of illustrative embodiments thereof, which is to be read in connection with the accompanying drawings.

DETAILED DESCRIPTION

As described herein, an embodiment of the present invention includes identifying and prioritizing errors in CMs of distribution networks for efficient field inspections. At least one embodiment of the invention includes identifying and/or generating a prioritized list of erroneous assets (such as feeders, transformers, and meters; also referred to herein as installations) in an electrical distribution network by ranking the assets based on measured error ratings of each individual asset to optimally (minimally) schedule field inspections.

As described herein, such an embodiment can include obtaining geo-spatial data and characteristics of installations (such as feeder branches, transformers and customer meters), as well as obtaining data pertaining to an existing CM of the area of interest, and load data (for example, time-series) of the relevant customers. Such geo-spatial data can include, for example, geographical coordinates of the relevant installations, as well as customer addresses. Such data pertaining to the existing CM can include, for example, designated phase(s), rated load capacity(ies), and network topography present in a pertinent database (which can include connections of customers, transformers and feeder branches).

Additionally, such an embodiment can include fusing and processing the obtained data for calculating error probabilities of the assets and generating error ratings with respect to each asset. Subsequently, one or more embodiments of the invention can include generating and providing, based on the generated error ratings, a prioritized list of possibly erroneous assets for field inspections (which typically are related to scheduled repairs and maintenance) within the distribution network. Specifically, at least one embodiment of the invention can include using the prioritized lists and existing work orders of the utility to efficiently schedule field inspections for maintaining the CM.

In accordance with at least one embodiment of the invention, generating a prioritized list of errors in the CM is carried out via an unsupervised approach, wherein such an approach requires no prior training, and hence no subset of assets needs to be labelled as correct or erroneous for the algorithms detailed herein to function. Further, at least one embodiment of the invention can include incorporating and/or implementing a feature, based on the obtained and processed data detailed above and herein, to consider orphaned meters (that is, meters which do not have a transformer in the recorded CM) and assign such meters to the correct transformer and/or include such meters in the ranked list of erroneous devices.

Accordingly, and as further described herein, at least one embodiment of the invention includes implementing an integrated approach to schedule efficient field inspections based on the existing work schedule of the utility and a ranked list of erroneous transformers and meters.

Figure 1:
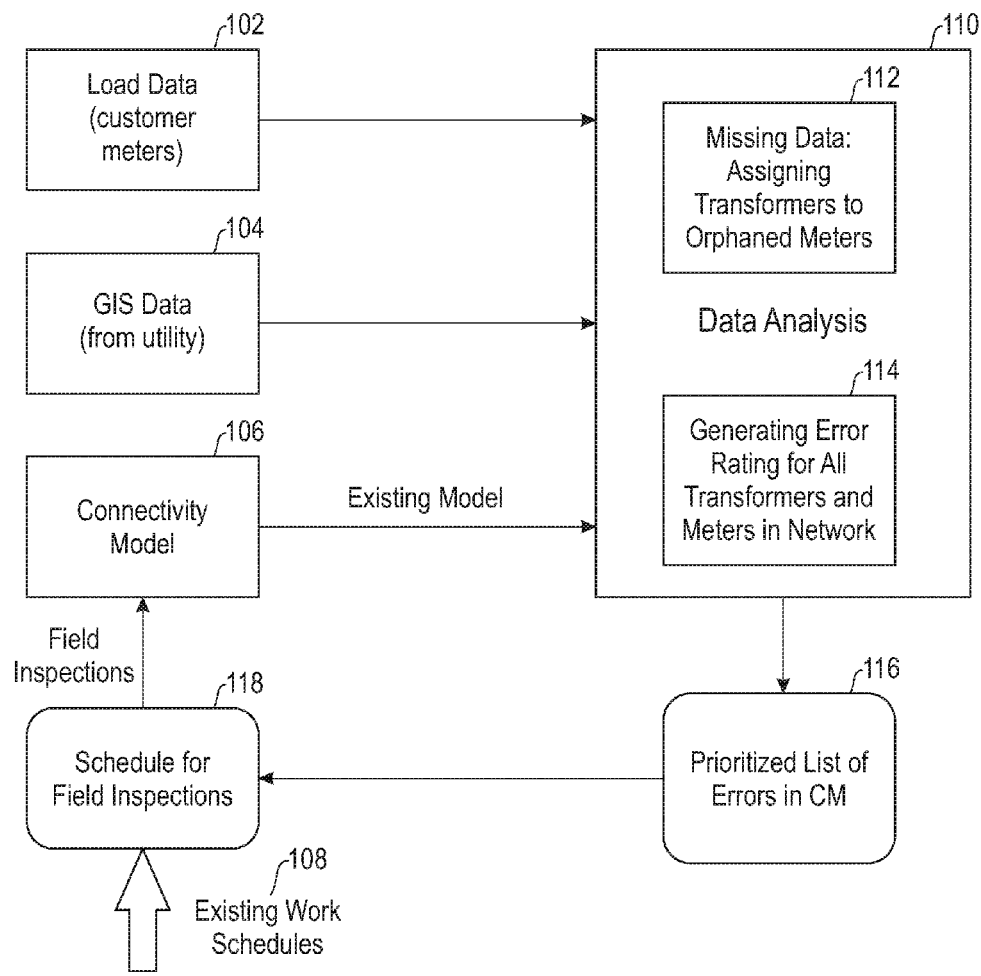
FIG. 1 is a diagram illustrating system architecture, according to an exemplary embodiment of the invention.

FIG. 1 is a diagram illustrating system architecture, according to an embodiment of the invention. By way of illustration, FIG. 1 depicts a data analysis component 110, which receives input in the form of load data (arising from customer meters) 102, geographic information system (GIS) data (derived from the utility) 104, and an existing connectivity model (pertaining to a given distribution network) 106. As also depicted in FIG. 1, the data analysis component 110 includes a missing data component 112 and an error rating generation component 114. The missing data component 112 assigns, based on the received input, transformers to orphaned meters. Also, the error rating generation component 114 generates, based on the received input, an error rating for all transformers and meters in the distribution network.

The above-noted outputs generated by the missing data component 112 and the error rating generation component 114 are combined and/or utilized to generate and output a prioritized list of errors in the CM 116. The prioritized list 116 is subsequently utilized, in conjunction with an input of existing work schedules (relating to the distribution network) to generate a schedule for field inspections (which is used to update the CM 106).

As described herein, orphaned meters refer to meters listed without a parent transformer. For meters, the data of the connected transformer play an important role in the error rating. But orphaned meters do not have a listed transformer listed. Therefore, one or more embodiments of the invention include determining the most likely transformer assignment for each of the orphaned meters using low resolution load data from the meters, meta data from the transformers, and/or GIS data of the meters and transformers. For example, such an embodiment can include using a combination of spatial distance and over/under-load error-fit to assign customers (to transformers) such that the over/under-load across all distribution transformers under the feeder is reduced and/or minimized.

By way of further example, at least one embodiment of the invention can include implementing an optimization formulation as follows:
set $L_{jt}=L_j \forall t$;
$error_{jt}=\{L_{jt}-\Sigma_i m_{it}*\alpha_{ij}\}$);
$min_\alpha \Sigma_j \|error_j\|_2$; OR
$min_\alpha \Sigma_j \|error_j\|_1$, wherein:
i, j refers to index customers and transformers under a feeder, respectively;

$\theta$ refers to the threshold distance derived from data and crew recommendations;
$\alpha_{ij} \in \{0, 1\}$ refers to the assignment of customer i to transformer j;
$\Sigma_i \alpha_{ij}=1, \forall_j$ refers to the observation that a customer can be assigned to 1 transformer;
$\alpha_{ij}$ is unknown for orphaned meters, and is known for other meters;
for all orphaned meters, i is set as $\alpha_{ij}=0$ if $d_{ij}>\theta$, $\forall_j$, wherein $d_{ij}$ refers to the geodesic distance between i and j;
$m_{it}$ refers to the load of customer i in time-step t;
$L_j$ refers to the load of transformer j based on kilovolt-ampere (KVA) and a power factor for a time interval.

Variants of the above-detailed optimization formulation can include, for example, a dual objective by weighing over/under-load and spatial distance together.

Additionally, at least one embodiment of the invention can include the following alternative low computation approach:

For each orphaned meter, check all of the transformers within a given $\theta$ distance from the meter. For each of such transformers, consider the meter under that transformer, compute the average (over time) of the aggregate level consumption of all of the meters (including the orphan meter) under that transformer, and determine the difference between the KVA rating of the transformer with the average value computed above (and the KVA rating without). Further, such an approach includes assigning the orphan meter to the transformer for which the difference is maximum.

Accordingly, such an approach can include the following:

$$T(o) = \underset{t \in N_\theta(o)}{\mathrm{argmax}} \left\{ L_t^{KVA} - \frac{\sum_{i \in M(t)} m_i + m_o}{T} \right\},$$

wherein:
T(o)=the parent transformer of the orphaned meter o;
t=a transformer;
$L_t^{KVA}$=the KVA rating of the transformer;
$N_\theta(o)$=all of the transformers within $\theta$ distance from the orphaned meter;
$m_i$=the total energy consumed by the meter i over T time slots;
M(t) is the set of meters connected to transformer t; and
$m_o$ is the orphaned meter.

To avoid an order effect of the orphaned meters using the above approach, one or more embodiments of the invention can include running the above approach multiple times with different random orderings of the orphan meters, and selecting the solution for which the sum of the cost functions over all of the orphan meters is maximized.

Figure 2:
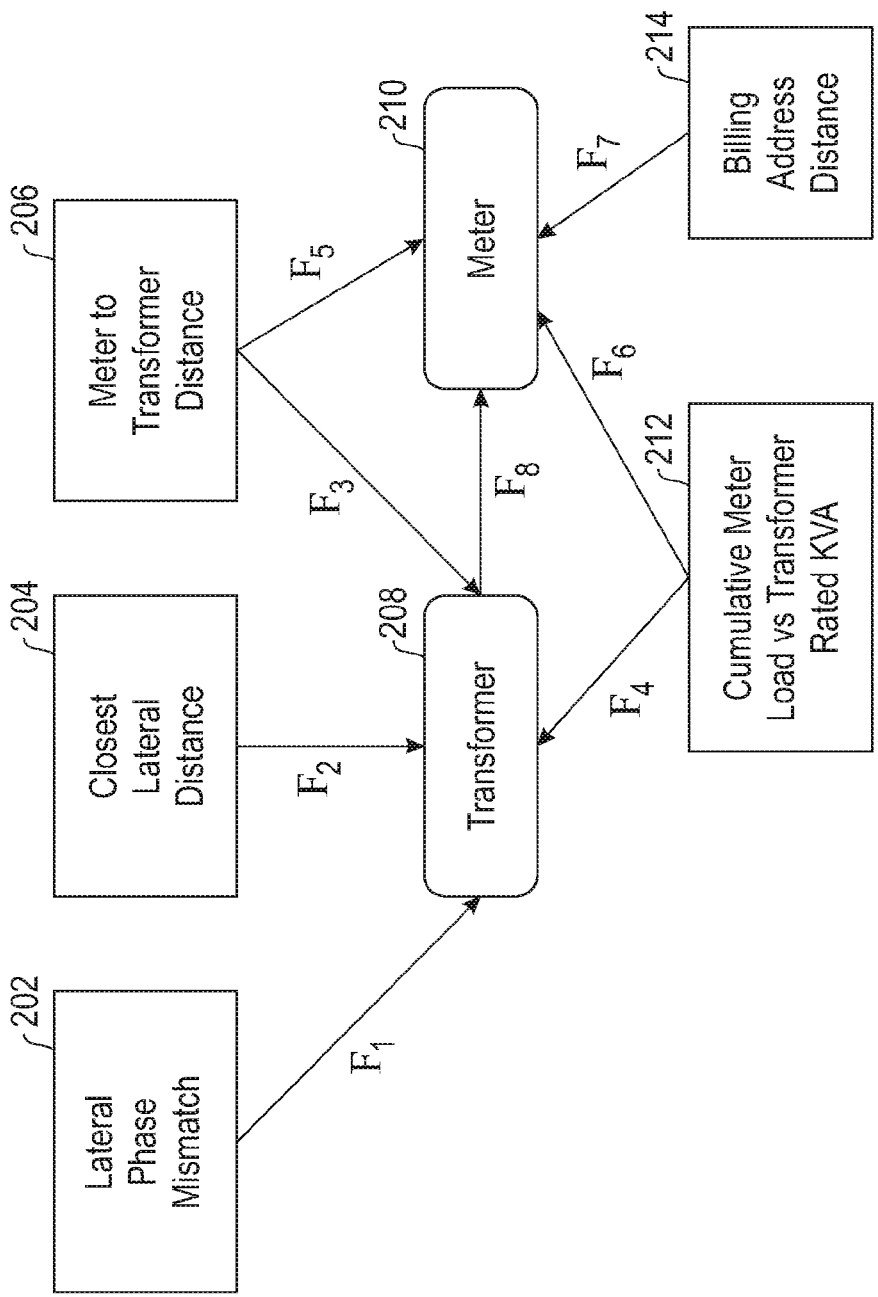
FIG. 2 is a diagram illustrating error inputs, according to an exemplary embodiment of the invention.

FIG. 2 is a diagram illustrating error inputs, according to an exemplary embodiment of the invention. By way of illustration, FIG. 2 depicts a transformer 208, which receives input $F_1$ (wherein $F_1$ is a logistic function with continuous values in (0, 1)) from a lateral phase mismatch component 202, input $F_2$ from a closest lateral distance component 204, input $F_3$ from a meter-to-transformer distance component 206, and input $F_4$ from a cumulative meter load versus transformer rated KVA component 212. The transformer 208 provides, as input, $F_8$ to meter 210, which also receives input $F_5$ from the meter-to-transformer distance component 206, as well as input $F_7$ from a billing address distance component 214 and input $F_6$ from the cumulative meter load versus transformer rated KVA component 212.

As further detailed herein, $E_T$ represents the error rating for a transformer, and similarly, $E_M$ represents the error rating of a meter. Additionally, as also further described herein, specific weights (w) can be assigned to each of the input functions (F . . ) in connection with generating such error ratings. The values for 'w' can be determined, for example, through consultation with one or more experts.

In one or more embodiments of the invention, for $F_2$, $F_3$, $F_5$ and $F_7$, $F_i(x)=1/(1+e^{-(\beta 0+\beta 1x)})$. The values of $\beta_0$ and $\beta_1$ influence the shape of the curve of the logistic function given by $F_i(x)$.

As noted above, the transformer 208 can receive inputs from the lateral phase mismatch component 202, the closest lateral distance component 204, the meter-to-transformer distance component 206, and the cumulative meter load versus transformer rated KVA component 212. Specifically, the lateral phase mismatch component 202 determines the spatially closest lateral and compares its phase with the transformer phase. For example, $F_i$('mismatch')=1, and $F_1$('match')=0, wherein the transformer phase not being a subset of lateral phase implies an error. Also, the closest lateral distance component 204 calculates the distance to the spatially closest lateral and uses $F_2(x)$ over the distance to obtain a value in (0, 1). In one or more embodiments of the invention, $\beta_0$ and $\beta_1$ are determined based on the distribution of the lateral-transformer distances across the feeder.

Additionally, the meter-to-transformer distance component 206 obtains, from the CM, the list of customer meters connected to the transformer. Using spatial data, the meter-to-transformer distance component 206 calculates the mean meter distances of the transformer, and uses $F_3(x)$ over the mean distance to obtain a value in (0, 1). In one or more embodiments of the invention, $\beta_0$ and $\beta_1$ are determined based on the distribution of the meter-transformer distances across the feeder. Further, the cumulative meter load versus transformer rated KVA component 212 obtains recent load time-series data of all of the meters connected to the given transformer, aggregates the load data at every time period and checks such data against the rating of the transformer. The percentage of times that the cumulative load exceeds the rated load is used to generate 'x,' wherein $F_4(x)$ gives a value in (0, 1).

As also noted above, the meter 210 can receive inputs from the transformer 208, the cumulative meter load versus transformer rated KVA component 212, and the billing address distance component 214. Specifically, the transformer 208 obtains the details of the connected transformer from the existing CM, and using spatial data, calculates the distance of the meter to the transformer. $F_5(x)$ is used over the distance to obtain a value in (0, 1), and $\beta_0$ and $\beta_1$ are determined based on the distribution of the meter-transformer distances across the feeder.

Additionally, the cumulative meter load versus transformer rated KVA component 212 obtains recent load time-series data of all of the meters connected to the transformer, aggregates the load data at every time period, and checks such data against the rating of the transformer. The percentage of times that the cumulative load exceeds the rated load is used to generate 'x,' and $F_6(x)$ gives a value in (0, 1). Further, the billing address distance component 214 obtains the address of a customer from the billing data, and the geo-coordinates of the customer meter from the spatial database. The address is plotted on a map, and the billing address distance component 214 calculates the address' distance to the geo-coordinates of the meter. $F_7(x)$ is used over the distance to obtain a value in (0, 1), and $\beta_0$ and $\beta_1$ are determined based on the distribution of these distances for every feeder.

If the meter was originally an orphaned meter, then the error rating $E_T$ of the newly assigned transformer T has an influence on the meter and is used as $F_8=uE_T/(w_1+W_2+w_3+w_4)$. u=1 if the meter was orphaned meter; 0 otherwise. $F_8$ gives a value in (0, 1).

Having obtained the individual error probability values for all inputs, such values are combined to produce error ratings for all of the transformers and customer meters. As such, the transformer error rating $(E_T)=w_1F_1+w_2F_2+w_3F_3+w_4F_4$, wherein $w_1$ is the weight assigned to input i. Also, the meter error rating $(E_M)=w_5F_5+w_6F_6+w_7F_7+w_8F_8$. Weights can be determined based on domain knowledge, client preferences, history, etc. For example, lateral-transformer distance might be given higher weightage than meter-transformer distances. By way of additional example, some users/clients may prefer giving less weightage (or no weightage) to customer address distance (if geographical maps are known to be inaccurate). Also, if clients are more confident of the accuracy of the load data than that of the spatial data, then the load inputs might be given higher weightage.

As also detailed herein, at least one embodiment of the invention includes generating prioritized lists. With respect to a transformer list, for a given section of the service area of a client, the ratings for all transformers are obtained and ranked in descending order of the rating. With respect to a meter list, for a given section of the service area, all meters can also be ranked on the basis of their error rating. With respect to a combined list, a grand list containing both the transformers and the meters can be generated using the error rating as the parameter and adding specific weights to the set of transformers or meters, if needed and/or desired.

Additionally, as further detailed herein, such generated prioritized lists can be utilized to append to an existing network work schedule or to create a new network work schedule. In appending an existing work schedule, work scheduling (WS) is a function of a transformer/meter error rating (E) and a worker's distance (D) from the erroneous transformer/meter at time t, such that WS=f(E, D(t)). Based on the worker's availability in that area at a particular time, near-by erroneous transformers/meters can be appended to the worker's existing work schedule.

In creating a new work schedule, WS is a function of clustered erroneous transformers/meters (C) based on spatial location (l) and error rating (e), as well as a worker's office distance (D) from the erroneous transformer/meter cluster, such that WS=f(C(l, e), D). As such, in one or more embodiments of the invention, erroneous assets are clustered based on spatial location and error ratings, and based on the worker's office location and clustered transformers/meters location, work schedules can be assigned to the worker. Any work scheduling algorithm (such as Priority Scheduling, Fastest Job First, etc.) can be used to achieve this task.

Figure 3:
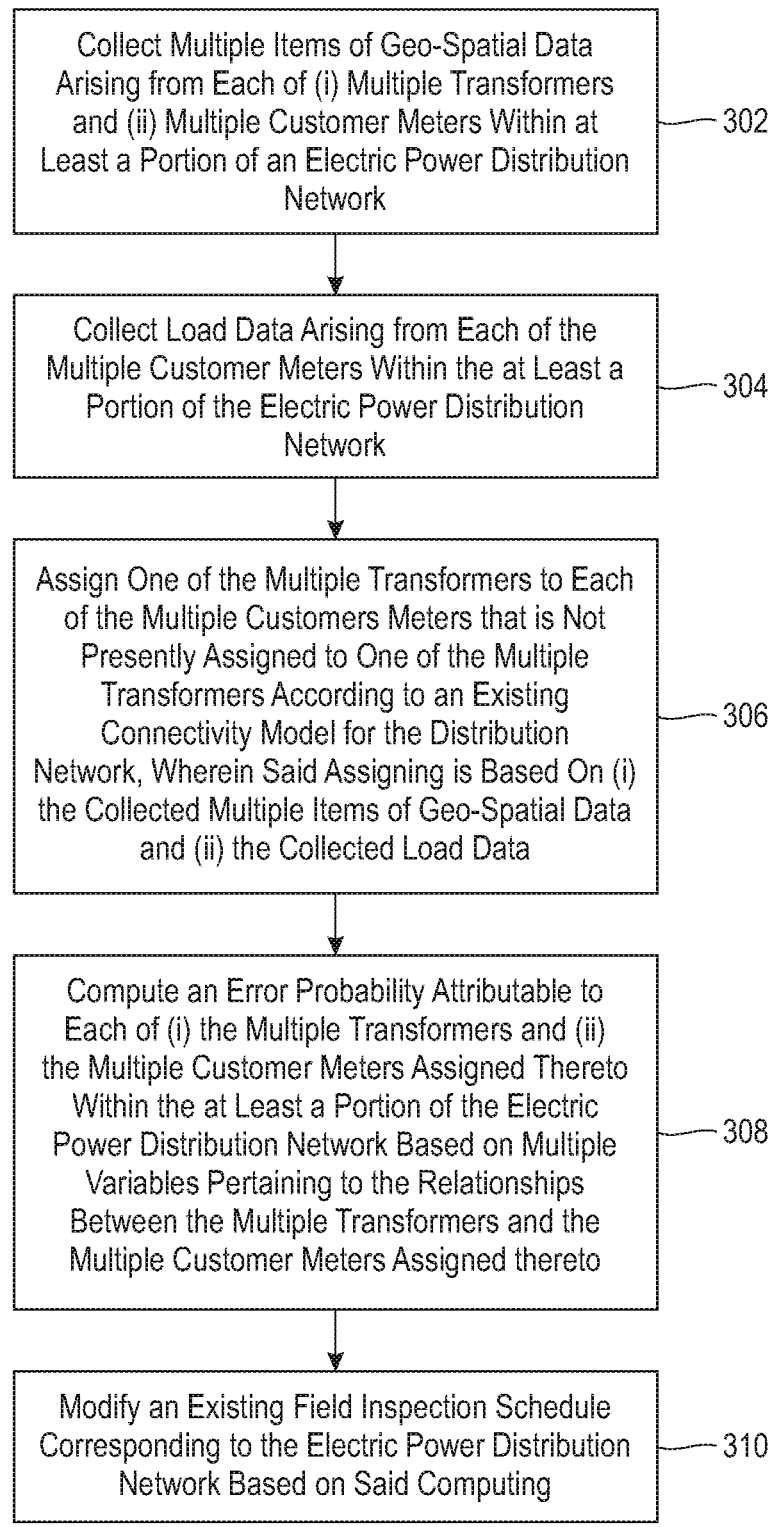
FIG. 3 is a flow diagram illustrating techniques, according to an embodiment of the invention.

FIG. 3 is a flow diagram illustrating techniques according to an embodiment of the present invention. Step 302 includes collecting multiple items of geo-spatial data arising from each of (i) multiple transformers within at least a portion of an electric power distribution network and (ii) multiple customer meters within the at least a portion of the electric power distribution network. Collecting the multiple items of geo-spatial data can further include collecting multiple items of geo-spatial data from each of one or more feeders within the at least a portion of the electric power distribution network. In at least one embodiment of the invention, the collecting step includes collecting the multiple items of geo-spatial data from a utility source.

Additionally, the multiple items of geo-spatial data can include customer addresses corresponding to each of the multiple customer meters, geographic coordinates of each of (i) the multiple transformers and (ii) the multiple customer meters, and/or geographic information system data.

Step 304 includes collecting load data arising from each of the multiple customer meters within the at least a portion of the electric power distribution network. The load data can include time-series data arising from each of the multiple customer meters.

Step 306 includes assigning one of the multiple transformers to each of the multiple customer meters that is not presently assigned to one of the multiple transformers according to an existing connectivity model for the distribution network, wherein said assigning is based on (i) the collected multiple items of geo-spatial data and (ii) the collected load data. Assigning can include using a combination of (i) spatial distance between (a) each of the multiple transformers and (b) each of the multiple customer meters that is not presently assigned to one of the multiple transformers, and (ii) an over/under-load error-fit of each of the multiple transformers to assign each of the multiple customer meters that is not presently assigned to one of the multiple transformers such that the over/under-load across all of the multiple transformers is reduced.

Step 308 includes computing an error probability attributable to each of (i) the multiple transformers and (ii) the multiple customer meters assigned thereto within the at least a portion of the electric power distribution network based on multiple variables pertaining to the relationships between the multiple transformers and the multiple customer meters assigned thereto. The multiple variables can include a phase comparison between the multiple transformers and the multiple customer meters assigned thereto, meter-to-transformer distance between the multiple transformers and the multiple customer meters assigned thereto, a comparison between a kilovolt-ampere rating of each of the multiple transformers and a cumulative meter load assigned to each of the multiple transformers, and/or a distance between a customer billing address and a corresponding one of the customer meters.

Step 310 includes modifying an existing field inspection schedule corresponding to the electric power distribution network based on said computing. The said modifying step can be based at least in part on a worker's distance from a given transformer and/or customer meter at a given time.

The techniques depicted in FIG. 3 can also include generating a prioritized list of errors in the existing connectivity model based on said computed error probabilities. Also, the techniques depicted in FIG. 3 can include combining the computed error probability of each of the multiple transformers to generate a transformer error rating, and combining the error probability of each of the multiple customer meters to generate a customer meter error rating. Such an embodiment of the invention can additionally include generating a prioritized list of errors in the existing connectivity model based on (i) the generated transformer error rating and (ii) the generated customer meter error rating.

Also, an additional embodiment of the invention includes generating a new field inspection schedule corresponding to the electric power distribution network, to replace an existing field inspection schedule, based on the above-noted computing. Additionally, generating the new field inspection schedule can be based at least in part on (i) the location of one or more groupings of transformers and customer meters and (ii) one or more worker locations.

The techniques depicted in FIG. 3 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIG. 3 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

An embodiment of the invention or elements thereof can be implemented in the form of an apparatus including a memory and at least one processor that is coupled to the memory and configured to perform exemplary method steps.

Figure 4:
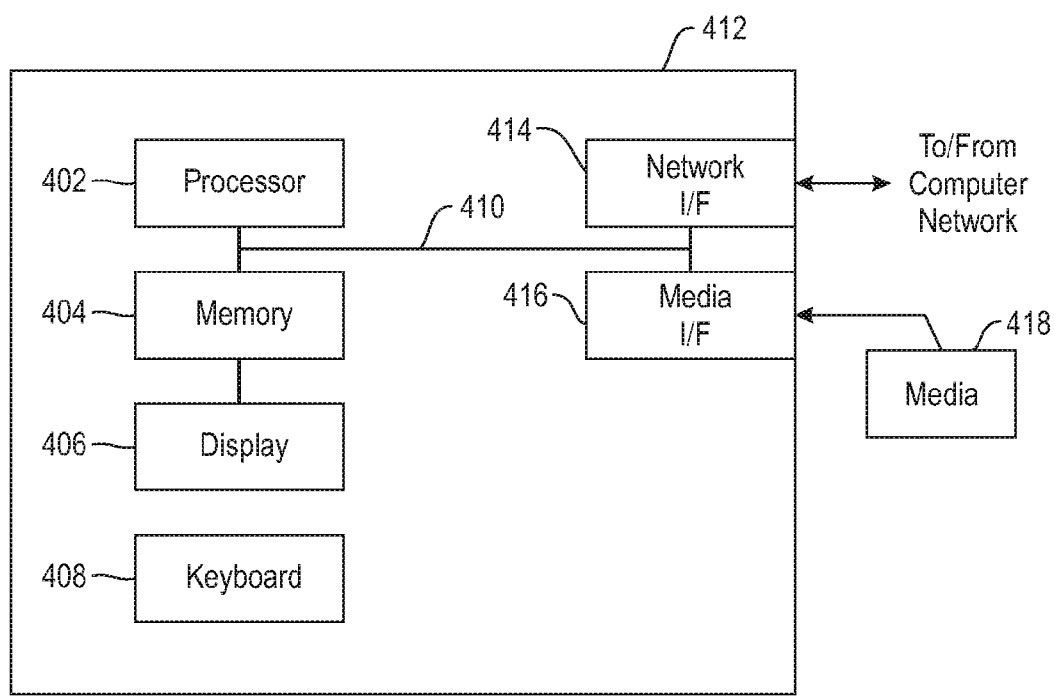
FIG. 4 is a system diagram of an exemplary computer system on which at least one embodiment of the invention can be implemented.

Additionally, an embodiment of the present invention can make use of software running on a computer or workstation. With reference to FIG. 4, such an implementation might employ, for example, a processor 402, a memory 404, and an input/output interface formed, for example, by a display 406 and a keyboard 408. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 402, memory 404, and input/output interface such as display 406 and keyboard 408 can be interconnected, for example, via bus 410 as part of a data processing unit 412. Suitable interconnections, for example via bus 410, can also be provided to a network interface 414, such as a network card, which can be provided to interface with a computer network, and to a media interface 416, such as a diskette or CD-ROM drive, which can be provided to interface with media 418.

Accordingly, computer software including instructions or code for performing the methodologies of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 402 coupled directly or indirectly to memory elements 404 through a system bus 410. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including, but not limited to, keyboards 408, displays 406, pointing devices, and the like) can be coupled to the system either directly (such as via bus 410) or through intervening I/O controllers (omitted for clarity).

Network adapters such as network interface 414 may also be coupled to the system to enable the data processing system to become coupled to other data processing systems or remote printers or storage devices through intervening private or public networks. Modems, cable modems and Ethernet cards are just a few of the currently available types of network adapters.

As used herein, including the claims, a "server" includes a physical data processing system (for example, system 412 as shown in FIG. 4) running a server program. It will be understood that such a physical server may or may not include a display and keyboard.

The present invention may be a system, a method, and/or a computer program product at any possible technical detail level of integration. The computer program product may include a computer readable storage medium (or media) having computer readable program instructions thereon for causing a processor to carry out embodiments of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present invention.

Embodiments of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 402. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICS), functional circuitry, an appropriately programmed digital computer with associated memory, and the like. Given the teachings of the invention provided herein, one of ordinary skill in the related art will be able to contemplate other implementations of the components of the invention.

Additionally, it is understood in advance that embodiments of the present invention are capable of being implemented in conjunction with any type of computing environment now known or later developed.

For example, cloud computing is a model of service delivery for enabling convenient, on-demand network access to a shared pool of configurable computing resources (for example, networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (for example, country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (for example, storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (for example, web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (for example, host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (for example, mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (for example, cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

At least one embodiment of the present invention may provide a beneficial effect such as, for example, using geospatial and load data present with utilities along with an existing connectivity model to generate data error probabilities for individual installations such as transformers and customer meters.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
    collecting multiple items of geo-spatial data arising from each of (i) multiple transformers within at least a portion of an electric power distribution network and (ii) multiple customer meters within the at least a portion of the electric power distribution network;
    collecting load data arising from each of the multiple customer meters within the at least a portion of the electric power distribution network;
    assigning one of the multiple transformers to each of the multiple customer meters that is not presently assigned to one of the multiple transformers according to an existing connectivity model for the distribution network, wherein said assigning is based on (i) the collected multiple items of geo-spatial data and (ii) the collected load data;
    computing, based at least in part on the collected multiple items of geo-spatial data and the collected load data, an error probability attributable to each of (i) the multiple transformers and (ii) the multiple customer meters assigned thereto within the at least a portion of the electric power distribution network based on multiple variables pertaining to the relationships between the multiple transformers and the multiple customer meters assigned thereto, wherein each such error probability represents likelihood of an error in the existing connectivity model caused by the given transformer or customer meter; and
    modifying an existing field inspection schedule corresponding to the electric power distribution network based on said computing;
    wherein the steps are carried out by at least one computing device.

2. The computer-implemented method of claim 1, comprising:
    generating a prioritized list of errors in the existing connectivity model based on said computed error probabilities.

3. The computer-implemented method of claim 1, comprising:
    combining the computed error probability of each of the multiple transformers to generate a transformer error rating; and
    combining the error probability of each of the multiple customer meters to generate a customer meter error rating.

4. The computer-implemented method of claim 3, comprising:
    generating a prioritized list of errors in the existing connectivity model based on (i) the generated transformer error rating and (ii) the generated customer meter error rating.

5. The computer-implemented method of claim 1, wherein said collecting the multiple items of geo-spatial data comprises collecting multiple items of geo-spatial data from each of one or more feeders within the at least a portion of the electric power distribution network.

6. The computer-implemented method of claim 1, wherein the multiple items of geo-spatial data comprise customer addresses corresponding to the multiple customer meters.

7. The computer-implemented method of claim 1, wherein said collecting the multiple items of geo-spatial data comprises collecting the multiple items of geo-spatial data from a utility source.

8. The computer-implemented method of claim 1, wherein the multiple items of geo-spatial data comprise geographic coordinates of each of (i) the multiple transformers and (ii) the multiple customer meters.

9. The computer-implemented method of claim 1, wherein the multiple items of geo-spatial data comprise geographic information system data.

10. The computer-implemented method of claim 1, wherein the load data comprise time-series data arising from each of the multiple customer meters.

11. The computer-implemented method of claim 1, wherein said assigning comprises using a combination of (i) spatial distance between (a) each of the multiple transformers and (b) each of the multiple customer meters that is not presently assigned to one of the multiple transformers, and (ii) an over/under-load error-fit of each of the multiple transformers to assign each of the multiple customer meters that is not presently assigned to one of the multiple transformers such that the over/under-load across all of the multiple transformers is reduced.

12. The computer-implemented method of claim 1, wherein the multiple variables comprise a phase comparison between the multiple transformers and the multiple customer meters assigned thereto.

13. The computer-implemented method of claim 1, wherein the multiple variables comprise meter-to-transformer distance between the multiple transformers and the multiple customer meters assigned thereto.

14. The computer-implemented method of claim 1, wherein the multiple variables comprise a comparison between a kilovolt-ampere rating of each of the multiple transformers and a cumulative meter load assigned to each of the multiple transformers.

15. The computer-implemented method of claim 1, wherein the multiple variables comprise a distance between a customer billing address and a corresponding one of the customer meters.

16. The computer-implemented method of claim 1, wherein said modifying is based at least in part on a worker's distance from a given transformer and/or customer meter at a given time.

17. A computer program product comprising a computer readable storage medium having program instructions embodied therewith, the program instructions executable by a device to cause the device to:
collect multiple items of geo-spatial data arising from each of (i) multiple transformers within at least a portion of an electric power distribution network and (ii) multiple customer meters within the at least a portion of the electric power distribution network;
collect load data arising from each of the multiple customer meters within the at least a portion of the electric power distribution network;
assign one of the multiple transformers to each of the multiple customer meters that is not presently assigned to one of the multiple transformers according to an existing connectivity model for the distribution network, wherein said assigning is based on (i) the collected multiple items of geo-spatial data and (ii) the collected load data;
compute, based at least in part on the collected multiple items of geo-spatial data and the collected load data, an error probability attributable to each of (i) the multiple transformers and (ii) the multiple customer meters assigned thereto within the at least a portion of the electric power distribution network based on multiple variables pertaining to the relationships between the multiple transformers and the multiple customer meters assigned thereto, wherein each such error probability represents likelihood of an error in the existing connectivity model caused by the given transformer or customer meter; and
modify an existing field inspection schedule corresponding to the electric power distribution network based on said computing.

18. A system comprising:
a memory; and
at least one processor coupled to the memory and configured for:
collecting multiple items of geo-spatial data arising from each of (i) multiple transformers within at least a portion of an electric power distribution network and (ii) multiple customer meters within the at least a portion of the electric power distribution network;
collecting load data arising from each of the multiple customer meters within the at least a portion of the electric power distribution network;
assigning one of the multiple transformers to each of the multiple customer meters that is not presently assigned to one of the multiple transformers according to an existing connectivity model for the distribution network, wherein said assigning is based on (i) the collected multiple items of geo-spatial data and (ii) the collected load data;
computing, based at least in part on the collected multiple items of geo-spatial data and the collected load data, an error probability attributable to each of (i) the multiple transformers and (ii) the multiple customer meters assigned thereto within the at least a portion of the electric power distribution network based on multiple variables pertaining to the relationships between the multiple transformers and the multiple customer meters assigned thereto, wherein each such error probability represents likelihood of an error in the existing connectivity model caused by the given transformer or customer meter; and
modifying an existing field inspection schedule corresponding to the electric power distribution network based on said computing.

19. A computer-implemented method, comprising:
collecting multiple items of geo-spatial data arising from each of (i) multiple transformers within at least a portion of an electric power distribution network and (ii) multiple customer meters within the at least a portion of the electric power distribution network
collecting load data arising from each of the multiple customer meters within the at least a portion of the electric power distribution network;
assigning one of the multiple transformers to each of the multiple customer meters that is not presently assigned to one of the multiple transformers according to an existing connectivity model for the distribution network, wherein said assigning is based on (i) the collected multiple items of geo-spatial data and (ii) the collected load data;
computing, based at least in part on the collected multiple items of geo-spatial data and the collected load data, an error probability attributable to each of (i) the multiple transformers and (ii) the multiple customer meters assigned thereto within the at least a portion of the electric power distribution network based on multiple variables pertaining to the relationships between the multiple transformers and the multiple customer meters assigned thereto, wherein each such error probability represents likelihood of an error in the existing connectivity model caused by the given transformer or customer meter; and
generating a new field inspection schedule corresponding to the electric power distribution network, to replace an existing field inspection schedule, based on said computing;
wherein the steps are carried out by at least one computing device.

20. The computer-implemented method of claim 19, wherein said generating the new field inspection schedule is based at least in part on (i) the location of one or more groupings of transformers and customer meters and (ii) one or more worker locations.

* * * * *